United States Patent
Morita et al.

(10) Patent No.: US 9,362,313 B2
(45) Date of Patent: Jun. 7, 2016

(54) THIN FILM TRANSISTOR AND DISPLAY DEVICE

(71) Applicant: Kobe Steel, Ltd., Kobe-shi (JP)

(72) Inventors: Shinya Morita, Kobe (JP); Aya Miki, Kobe (JP); Hiroaki Tao, Kobe (JP); Toshihiro Kugimiya, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 14/387,496

(22) PCT Filed: May 8, 2013

(86) PCT No.: PCT/JP2013/062978
§ 371 (c)(1),
(2) Date: Sep. 23, 2014

(87) PCT Pub. No.: WO2013/168748
PCT Pub. Date: Nov. 14, 2013

(65) Prior Publication Data
US 2015/0091000 A1    Apr. 2, 2015

(30) Foreign Application Priority Data

May 9, 2012    (JP) ................................. 2012-107813

(51) Int. Cl.
*H01L 29/04* (2006.01)
*H01L 27/12* (2006.01)
*H01L 29/786* (2006.01)

(52) U.S. Cl.
CPC ........ *H01L 27/1225* (2013.01); *H01L 29/7869* (2013.01); *H01L 29/78606* (2013.01); *H01L 29/78693* (2013.01); *H01L 29/78696* (2013.01)

(58) Field of Classification Search
CPC . H01L 21/775; H01L 27/12; H01L 29/66765; H01L 29/4908
USPC ..................................................... 257/59, 66
See application file for complete search history.

(56) References Cited

U.S. PATENT DOCUMENTS 8,558,382 B2    10/2013    Maeda et al.
9,123,820 B2 *   9/2015    Katoh ................. H01L 29/7869
(Continued)

FOREIGN PATENT DOCUMENTS

JP    2007 63649    3/2007
JP    2008 63214    3/2008
(Continued)

OTHER PUBLICATIONS

International Search Report and Written Opinion of the International Searching Authority Issued Jul. 30, 2013 in PCT/JP13/062978 Filed May 8, 2013.
(Continued)

*Primary Examiner* — Quoc Hoang
(74) *Attorney, Agent, or Firm* — Oblon, McClelland, Maier & Neustadt, L.L.P.

(57) ABSTRACT

Provided is an oxide-semiconductor-based thin film transistor having satisfactory switching characteristics and stress resistance. Change in threshold voltage through stress application is suppressed in the thin film transistor. The thin film transistor of excellent stability comprises a substrate and, formed thereon, at least a gate electrode, a gate insulating film, oxide semiconductor layers, a source-drain electrode, and a passivation film for protecting the gate insulating film, and oxide semiconductor layers, wherein the oxide semiconductor layers are laminated layers comprising a second oxide semiconductor layer consisting of In, Zn, Sn, and O and a first oxide semiconductor layer consisting of In, Ga, Zn, and O. The second oxide semiconductor layer is formed on the gate insulating film. The first oxide semiconductor layer is interposed between the second oxide semiconductor layer and the passivation film.

16 Claims, 5 Drawing Sheets

(56) References Cited

U.S. PATENT DOCUMENTS

| | | |
|---|---|---|
| 2004/0191530 A1 | 9/2004 | Inoue et al. |
| 2009/0197757 A1 | 8/2009 | Fukushima |
| 2009/0308635 A1 | 12/2009 | Yano et al. |
| 2009/0321732 A1 | 12/2009 | Kim et al. |
| 2010/0170696 A1 | 7/2010 | Yano et al. |
| 2010/0181565 A1 | 7/2010 | Sakata et al. |
| 2010/0187523 A1 | 7/2010 | Sakata et al. |
| 2010/0276685 A1 | 11/2010 | Itagaki et al. |
| 2011/0121244 A1 | 5/2011 | Yano et al. |
| 2011/0127521 A1 | 6/2011 | Yamazaki |
| 2011/0193083 A1 | 8/2011 | Kim et al. |
| 2012/0032163 A1 | 2/2012 | Yamazaki |
| 2012/0039126 A1 | 2/2012 | Saito |
| 2012/0049183 A1 | 3/2012 | Yamazaki |
| 2012/0119207 A1 | 5/2012 | Goto et al. |
| 2013/0009111 A1 | 1/2013 | Morita et al. |
| 2013/0009219 A1 | 1/2013 | Yamazaki et al. |
| 2013/0032798 A1 | 2/2013 | Miki et al. |
| 2013/0119324 A1 | 5/2013 | Morita et al. |
| 2013/0181218 A1 | 7/2013 | Maeda et al. |
| 2013/0228926 A1 | 9/2013 | Maeda et al. |
| 2013/0234081 A1 | 9/2013 | Goto et al. |
| 2013/0240802 A1 | 9/2013 | Miki et al. |
| 2013/0248855 A1 | 9/2013 | Miki et al. |
| 2013/0248858 A1 | 9/2013 | Morita et al. |
| 2013/0270109 A1 | 10/2013 | Morita et al. |
| 2013/0306469 A1 | 11/2013 | Kanamaru et al. |
| 2013/0313110 A1 | 11/2013 | Iwasaki et al. |
| 2013/0334039 A1 | 12/2013 | Goto et al. |
| 2013/0341183 A1 | 12/2013 | Goto et al. |
| 2013/0341617 A1 | 12/2013 | Tao et al. |
| 2014/0054588 A1 | 2/2014 | Maeda et al. |
| 2015/0123116 A1* | 5/2015 | Goto ................... C23C 14/08 257/43 |

FOREIGN PATENT DOCUMENTS

| | | |
|---|---|---|
| JP | 2009 164393 | 7/2009 |
| JP | 2010 16347 | 1/2010 |
| JP | 2010-21333 A | 1/2010 |
| JP | 2010 186994 | 8/2010 |
| JP | 2010 192881 | 9/2010 |
| JP | 2011-124360 A | 6/2011 |
| JP | 2011 135066 | 7/2011 |
| JP | 2012 26039 | 2/2012 |
| JP | 2012 54547 | 3/2012 |
| JP | 2012 64930 | 3/2012 |
| JP | 2012 67387 | 4/2012 |
| JP | 2013 38399 | 2/2013 |
| WO | 03 008661 | 1/2003 |
| WO | 2007 037191 | 4/2007 |

OTHER PUBLICATIONS

U.S. Appl. No. 14/113,322, filed Oct. 22, 2013, Maeda, et al.

* cited by examiner

THIN FILM TRANSISTOR AND DISPLAY DEVICE

FIELD OF TECHNOLOGY

The present invention relates to a thin film transistor (TFT) to be used in display devices such as liquid crystal displays and organic EL displays; and a display device having the TFT.

BACKGROUND ART

As compared with widely used amorphous silicon (a-Si), amorphous (non-crystalline) oxide semiconductors have high carrier mobility (also called as field-effect mobility, which may hereinafter be referred to simply as "mobility"), wide optical band gap, and film formability at low temperatures, and therefore, have highly been expected to be applied for next generation displays which are required to have large sizes, high resolution, and high-speed drives; resin substrates having low heat resistance; and others.

In the oxide semiconductors, amorphous oxide semiconductors consisting of indium, gallium, zinc and oxygen (In—Ga—Zn—O, which may hereinafter be referred to as "IGZO") have preferably been used. For example, non-patent literature documents 1 and 2 disclose thin film transistors (TFTs) in which a thin film of an oxide semiconductor having an In:Ga:Zn ratio equal to 1.1:1.1:0.9 (in atomic % ratio) was used for a semiconductor layer (an active layer). In addition, patent document 1 discloses an amorphous oxide semiconductor (IGZO) consisting of In, Ga, Zn, and O.

In patent document 2, amorphous oxide semiconductors consisting of In, Zn, Sn, and O (In—Zn—Sn—O, which may hereinafter be referred to as "IZTO") have been used.

Advancement of display devices in recent years to have large size, high definition, and high-speed drive necessitates materials having superior properties. Specifically, when an oxide semiconductor is used as a semiconductor layer of a thin film transistor, the oxide semiconductor is required to have not only high carrier mobility but also excellent TFT switching characteristics (transistor characteristics or TFT characteristics). More specifically, the oxide semiconductor is required to have, for example, (1) a high on-state current (i.e., the maximum drain current when a positive voltage is applied to both a gate electrode and a drain electrode); (2) a low off-state current (i.e., a drain current when a negative voltage is applied to the gate electrode and a positive voltage is applied to the drain voltage, respectively); (3) a low S value (Subthreshold Swing, i.e., a gate voltage needed to increase the drain current by one digit); (4) a stable threshold value (i.e., a voltage at which the drain current starts to flow when a positive voltage is applied to the drain electrode and either a positive voltage or a negative voltage is applied to the gate voltage, whose voltage may also be called as a threshold voltage) showing no change with time (which means that the threshold voltage is uniform in the substrate surface); and (5) a high mobility.

Furthermore, TFTs using the oxide semiconductor layers are required to have excellent resistance to stresses such as voltage application and light irradiation (stress resistance). It is pointed out that, for example, when a voltage is continuously applied to the gate electrode or when light in a blue-emitting band in which light absorption arises is continuously irradiated, charges are trapped at the interface between the gate insulator layer and the semiconductor layer, resulting in a variation of switching characteristics, such as a shift of the threshold voltage of a thin film transistor. In addition, for example, when a liquid crystal panel is driven or when a negative bias is applied to the gate electrode to turn on a pixel, the TFT is irradiated with light leaked out of the liquid crystal cell, and this light puts stress onto the TFT to cause deterioration in the characteristics. Indeed, when a thin film transistor is used, a variation of switching characteristics due to stress by voltage application causes a lowering of reliability in a display devices itself, such as a liquid crystal display or an organic EL display. For example, a variation of switching characteristics in an organic EL display creates a need to flow a current of several µA or higher for driving an organic EL element. Therefore, an improvement in the stress resistance (a small variation before and after the stress tests) has eagerly been desired. In particular, as display devices become large in size and high-speed drive, higher mobility and improved stress resistance are liable to be required.

It has been known that the deterioration of TFT characteristics by stresses such as bias application and light irradiation is caused by the formation of, for example, defects in the oxide semiconductor itself, and defects at an interface between the oxide semiconductor and a passivation film formed to protect the oxide semiconductor surface. It has been also known that the deterioration of TFT characteristics is caused by the formation of defects at an interface between the oxide semiconductor and an etch stopper layer which is formed on a surface of the oxide semiconductor to prevent damages during an etching process of a source-drain electrode. As the passivation film and the etch stopper layer, oxide films such as $SiO_2$, $Al_2O_3$, and $HfO_2$ are widely used. However, if water and oxygen molecules are adsorbed on the surface of the oxide semiconductor layer including the interface between the semiconductor layer and the passivation film or the etch stopper layer, then carrier concentration in the semiconductor layer is either decreased or increased, resulting in a shift of the threshold voltage and deterioration of reliability.

In order to keep up with the advancement in display devices in recent years to large size and high-speed drive, a material superior in TFT characteristics and stress resistance has thus been highly required.

PRIOR ART DOCUMENTS

Patent Document

Patent Document 1: Japanese Patent No. 4568828
Patent Document 2: Japanese Patent Laid-open Publication No. 2008-243928

Non-Patent Literature Document

Non-patent Literature Document 1: Kotai Butsuri (Solid State Physics), Vol. 44, p. 621 (2009)
Non-patent Literature Document 2: Nature, Vol. 432, p. 488 (2004)

SUMMARY OF THE INVENTION

Problems to be Solved by the Invention

The present invention has been completed under the circumstances described above, and one object of the present invention is to provide a thin film transistor comprising an oxide semiconductor layer, having excellent switching characteristics and high stress resistance, and in particular, showing a small variation of threshold voltage before and after the stress tests, and thereby having high stability, in addition to high carrier mobility; and a display device using the thin film transistor as described above.

More preferably, another object of the present invention is to provide a thin film transistor comprising an oxide semiconductor layer, having excellent wet etching property as well. Specifically, provided is a thin film transistor that suppresses residues generated in the course of a fabrication process (wet etching of a oxide semiconductor layer) and hence circumvents deterioration of the above-mentioned characteristics caused by the residues or the like.

Means for Solving the Problems

One thin film transistor of the present invention, which can solve the above-mentioned problems, is comprising on a substrate; a gate electrode; a gate insulating film; oxide semiconductor layers; a source electrode; a drain electrode; and a passivation film configured to protect the oxide semiconductor layers. The oxide semiconductor layers are laminated layers comprising; a second oxide semiconductor layer consisting of In, Zn, Sn, and O; and a first oxide semiconductor layer consisting of In, Ga, Zn, and O. The second oxide semiconductor layer is formed on the gate insulating film, and the first oxide semiconductor layer is formed between the second oxide semiconductor layer and the passivation film.

Another thin film transistor of the present invention, which can solve the above-mentioned problems, is comprising on a substrate; a gate electrode; a gate insulating film; oxide semiconductor layers; an etch stopper layer configured to protect a surface of the oxide semiconductor layers; a source electrode; a drain electrode. The oxide semiconductor layers are laminated layers comprising; a second oxide semiconductor layer consisting of In, Zn, Sn, and O; and a first oxide semiconductor layer consisting of In, Ga, Zn, and O. The second oxide semiconductor layer is formed on the gate insulating film, and the first oxide semiconductor layer is formed between the second oxide semiconductor layer and the etch stopper layer.

The chemical composition of the second oxide semiconductor layer preferably satisfies the requirements represented by expression (1) shown below if $[In]/([In]+[Sn]) \leq 0.50$, or expression (2) shown below if $[In]/([In]+[Sn]) > 0.50$.

$$[In]/([In]+[Zn]+[Sn]) \leq 1.4 \times \{[Zn]/([Zn]+[Sn])\} - 0.5 \quad (1)$$

$$[In]/([In]+[Zn]+[Sn]) \leq 0.3 \quad (2)$$

In the above, [In], [Zn], and [Sn] respectively represent the content ratios (atomic %) of the elements each relative to the total content of all the metal elements in the second oxide semiconductor layer.

Further, the chemical composition of the second oxide semiconductor layer preferably satisfies the requirements represented by expression (3) shown below;

$$[Zn]/([In]+[Zn]+[Sn]) \leq 0.830 \quad (3)$$

In a preferred embodiment of the present invention, a third oxide semiconductor layer comprising Ga is formed between the second oxide semiconductor layer and the gate insulating film. The third oxide semiconductor layer is preferably consists of In, Ga, Zn, and O.

Furthermore, in an embodiment of the present invention, the second oxide semiconductor layer may preferably have a thickness of 3 nm or more. The oxide semiconductor layer may preferably have a density of 6.0 g/cm$^3$ or higher.

The present invention further encompasses a display device having the thin film transistors as described above.

Effects of the Invention

The thin film transistor according to the present invention is excellent in terms of switching characteristics, stress resistance, and in particular, showing a small variation of threshold voltage before and after the stress biasing, in addition to high carrier mobility. Accordingly, the present invention can provide a thin film transistor having superior TFT characteristics and stress resistance. Further, a thin film transistor comprising an oxide semiconductor layer which is also excellent in wet etching property can be provided according to a preferred embodiment of the present invention. Electrical stability (reliability to optical irradiations) is significantly improved in a display device comprising such a thin film transistor.

MODE FOR CARRYING OUT THE INVENTION

Figure 1:
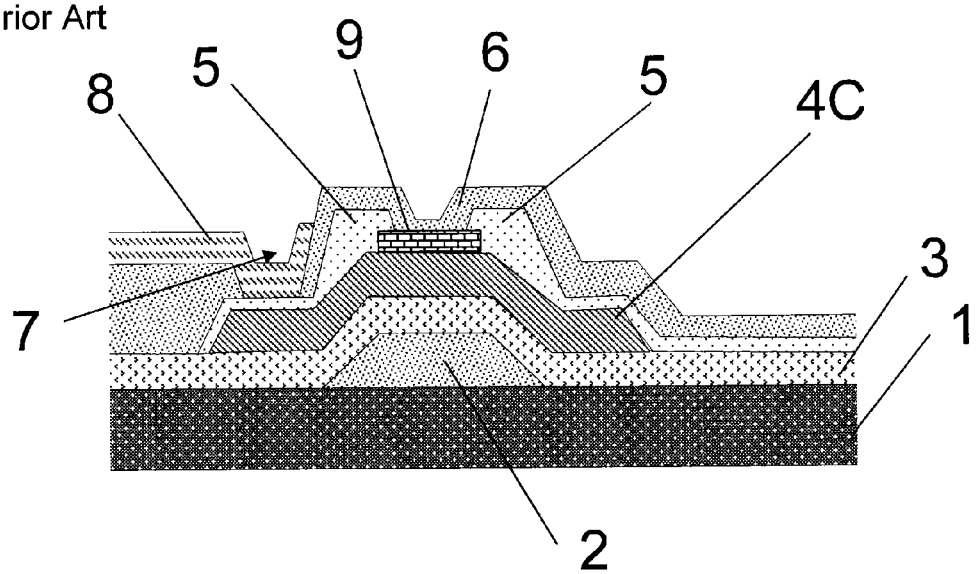
FIG. 1 is a schematic cross-sectional view for explaining an embodiment of a thin film transistor comprising a conventional oxide semiconductor layer (single layer).

The present inventors have made intensive studies in order to improve TFT characteristics and stress resistance of a TFT on a substrate comprising at least of a gate electrode, a gate insulating film, oxide semiconductor layers, a source-drain electrode, and a passivation film configured to protect the oxide semiconductor layers and the source-drain electrode; or a TFT on a substrate comprising at least of a gate electrode, a gate insulating film, oxide semiconductor layers, a source-drain electrode, and an etch stopper layer configured to protect the oxide semiconductor layers, and the source-drain electrode. As a result, the present inventors have found that the desired object is effectively accomplished by forming laminated layers consisting of IZTO (the second oxide semiconductor) and IGZO (the first oxide semiconductor) layers in that order from the side of a gate insulating film; between the gate insulating film and a passivation film or an etch stopper layer (hereinbelow, such a passivation film and an etch stopper layer are collectively referred to as a "protective film group" occasionally); and by preferably controlling the chemical composition of the second oxide semiconductor layer of IZTO to satisfy the expression (1) or the expression (2). The present invention was thus achieved.

In, Zn, and Sn constituting the second oxide semiconductor (IZTO) have weak chemical bonding with oxygen. Meanwhile, the passivation film and the etch stopper layer are composed of oxide based insulator such as $SiO_2$ or the like. Therefore, in the conventional single layer oxide semiconductor structure in which a second oxide semiconductor (IZTO) is in direct contact with a passivation film or an etch stopper layer (protective film group), the second oxide semiconductor layer (IZTO) is liable to form trapping level arising from oxygen deficiency at the hetero interface, which causes deterioration in mobility and stability such as stress resistance of the thin film transistor.

In the present invention, the density of defects is decreased at the interface between the protective film group and the second oxide semiconductor layer (IZTO) by interposing the first oxide semiconductor layer (IGZO) consisting of In, Ga, Zn, and O, which are elements to form a stable oxide at the interface.

Therefore, on the side of gate insulating layer the second oxide semiconductor layer (IZTO) having a higher mobility is formed to carry higher density of electric current. And on the surface of the second oxide semiconductor layer, which is the side of a passivation film or an etch stopper layer, the first oxide semiconductor layer (IGZO) is formed. With the configuration, the present invention realizes high mobility as well as high reliability, in other words, excellent TFT characteristics as well as stress resistance.

Further, in a preferred embodiment of the present invention, superior TFT characteristics can be secured without decreasing the sputtering rate as the composition of the second oxide semiconductor (IZTO) layer is controlled in the range of the expression (1) or (2).

Further, in a preferred embodiment of the present invention, wet etching property is improved as the composition of the second oxide semiconductor (IZTO) layer is controlled in the range of the expression (3).

In the present specification, the ratio expressed by [In]/([In]+[Zn]+[Sn]) is referred to as "the content ratio of In relative to the total content of all the metal elements" while the ratio expressed by [In]/([In]+[Sn]) is referred to as "the ratio of In". These ratios may be distinguished from each other. Following the definition, [Zn]/([In]+[Zn]+[Sn]) may be referred to as "the content ratio of Zn relative to the total content of all the metal elements".

Further, as described above, a passivation film and an etch stopper layer are collectively referred to as protective film group occasionally in the present specification.

Firstly, explanation is made on the second oxide semiconductor layer (constituent element: In, Zn, Sn, and O) among the oxide semiconductor layers of laminated layers of IZTO and IGTO, which characterizes the thin film transistor of the present invention.

In the oxide semiconductors, amorphous oxide semiconductors consisting of In, Ga, Zn and O have advantages to be widely used amorphous silicon (a-Si) such as a high carrier mobility, a wide optical band gap, and formability at low temperatures.

Respective ratio of the metals (In, Zn, and Sn) is not particularly limited as long as oxides containing these metals comprise an amorphous phase and show semiconductor properties. However, in order to secure good TFT characteristics without decreasing deposition rate of the oxide semiconductor layer, it is preferred that chemical composition of the second oxide semiconductor layer satisfies the requirements represented by expression (1) shown below if [In]/([In]+[Sn]) ≤0.50, and expression (2) shown below if [In]/([In]+[Sn]) >0.50;

$$[In]/([In]+[Zn]+[Sn]) \leq 1.4 \times \{[Zn]/([Zn]+[Sn])\} - 0.5 \quad (1)$$

$$[In]/([In]+[Zn]+[Sn]) \leq 0.3 \quad (2)$$

wherein [In], [Zn], and [Sn] respectively represent the content ratios (atomic %) of the elements each relative to the total content of all the metal elements in the oxide.

It is thus essential to control the ratio of In, represented by [In]/([In]+[Sn]) to satisfy the expression (1) or (2), delimited at the In ratio of 0.50. If the ratio of In is smaller than or equal to 0.50, the content ratio of In relative to the total content of all the metal elements is required to satisfy the expression (1). If the ratio of In is larger than 0.50, the content ratio of In relative to the total content of all the metal elements is required to satisfy the expression (2). The reason is explained in the following paragraphs.

Excessive amount of In turns IZTO from a semiconductor to a conductor, making the switching characteristics disappear. To prevent this, it is necessary to increase the partial pressure of oxygen for the deposition of IZTO. However, increasing the partial pressure of oxygen decreases the sputtering rate. Considering these technical issues, it is essential to control the ratio of In in all the metal elements constituting the oxide, specifically expressed as [In]/([In]+[Zn]+[Sn]), within an appropriate range in order to securing the switching characteristics of TFT while maintaining a low partial pressure of oxygen and a high sputtering rate.

On the other hand, considering the switching characteristics which is a prerequisite condition for applying the oxide semiconductor to a TFT, it is revealed that In has an influential effect in a compositional region where In is dominant while the TFT is liable to become conductive and lose the switching property in a compositional region where In and Sn are in majority. Accordingly, it is effective to control the ratio of In in all the metal elements constituting the oxide, depending on the ratio of In to a sum of In and Sn expressed as [In]/([In]+[Sn]), within an appropriate range in order to securing the switching property of TFT while maintaining a low partial pressure of oxygen and a high sputtering rate.

As a result of further investigation from the point of view, the present invention has been completed by finding that it is essential to control the ratio of In to satisfy the expression (1) or (2), delimited at the In ratio of 0.50.

The upper limit of the expression (2) is set in consideration of securing an appropriate range of carrier density for a semiconductor: $1 \times 10^{15}$ to $1 \times 10^{18}$ cm$^{-3}$. It is more preferably smaller than or equal to 0.25.

The lower limit of the left hand side value of the expressions (1) and (2); the ratio of In in all the metal elements constituting the oxide ([In]/([In]+[Zn]+[Sn])) is not particularly limited from the point of view to the characteristics. However, it is preferably higher than or equal to 0.05, and more preferably higher than or equal to 0.1 in both expressions in considering of securing high mobility.

It is also preferable to control the ratio of Sn in all the metal elements constituting the oxide ([Sn]/([In]+[Zn]+[Sn])) in an appropriate range, which further enhances the mobility because Sn plays a role of carrier conduction path as In does. The ratio of Sn is preferably greater than or equal to 0.05, and more preferably greater than or equal to 0.08. It is also preferable to appropriately control the upper limit of Sn appropriately balancing with other metal elements constituting IZTO. For example, in example No. 15, it was experimentally confirmed (not shown in Table) that the mobility was decreased to 10.1 $cm^2/Vs$ when the ratio of Sn in all the metal elements was decreased to 0.04 by modifying the chemical composition of example No. 15 from [In] of 8 atomic %, [Zn] of 85 atomic %, and [Sn] of 7 atomic % to [In] of 11 atomic %, [Zn] of 85 atomic % (unchanged), and [Sn] of 4 atomic %.

Although the expression (3) is not directly related to the primary problems to be solved by the present invention including improvements of TFT characteristics and stress resistance, it is related to preventing residues by wet etching that is a problem to be preferably solved by the present invention. It is not desirable that residues are generated by wet etching. It was revealed by the present studies that Zn is involved in the generation of residues in the wet etching, and that the residues are generated as the content of Zn in the oxide layer increases. The expression (3) is thus specified to regulate the ratio of Zn in all the metal elements constituting the oxide ([Zn]/([In]+[Zn]+[Sn])) for the purpose of preventing the formation of residues in the wet etching process. In order to secure the excellent wet etching property, the smaller the ratio of Zn in all the metal elements is, the better. The ratio of Zn is preferably smaller than or equal to 0.830, and more preferably smaller than or equal to 0.6.

The lower limit of the Zn ratio in all the metal elements constituting the oxide is not particularly limited from the point of view of wet etching property. However, the lower limit is preferably greater than or equal to, for example, 0.40, and more preferably greater than or equal to 0.45, having regard to the fact that it takes longer time to take for patterning as the etching rate is smaller.

Next, explanation is made on the first oxide semiconductor layer (constituent element: In, Ga, Sn, and O) among the oxide semiconductor layers of laminated layers of IZTO and IGTO, which characterizes the thin film transistor of the present invention.

As explained above, by interposing the first oxide semiconductor layer (IGZO) between the second oxide semiconductor layer (IZTO) and the protective film group, the stress resistance is improved particularly in a stress test in which light irradiation and negative bias are applied, and the threshold voltage shift toward negative direction is suppressed even with a prolonged the stress biasing. It is inferred that interposing the first oxide semiconductor layer (IGZO) between the second oxide semiconductor layer (IZTO) and the protective film group has an effect to suppress defect generation at the interface and stabilize the structure of the interface.

Among In, Ga, Zn, and O, which are constituting the first oxide semiconductor layer (IGZO), Ga has particularly low free energy of formation of oxide. The free energy of oxide formation of Ga is also lower than those of In, Zn, and Sn, which are constituting the second oxide semiconductor layer (IZTO). Having strong chemical bonding with oxygen, Ga forms stable oxides. It is thus inferred that, as compared with the other elements, Ga effectively suppresses formation of oxygen deficiency which causes generation of surplus electrons in the semiconductors. It is thus considered that presence of Ga causes; the formation of a stable oxide at the interface; the reduction of the oxygen deficiency; the suppression of defects at the interface with the second oxide semiconductor layer (IZTO); and the improvement of stress resistance to voltage biasing and light irradiation. It is noted here that the mobility in the oxide semiconductor layer as a whole shows little degradation in the present invention because the oxide semiconductor layer is not a single layer of IGZO but laminate layers of IZTO and IGZO, even if IGZO is inferior to Ga-free IZTO in terms of mobility.

By forming IGZO beneath the protective film group, as for a case of forming IZTO on top of the gate insulating film, the present invention has a further merit of deposition of a wide optical band gap film at low temperatures. By interposing the first oxide semiconductor layer (IGZO) between the protective film group and the second oxide semiconductor layer (IZTO), the generation of trapping level at the interface with the protective film group, which is a technical problem in the single layer oxide semiconductor structure, can be effectively suppressed and a thin film transistor of superior TFT characteristics and stress resistance may be obtained.

A preferred amount of Ga (preferred ratio of Ga) in all the metal elements constituting the first oxide semiconductor layer (IGZO) may be determined by considering carrier density and stability of semiconductor characteristics. If the amount of Ga is too small, there may be a case in which the effect of suppressing generation of oxygen deficiency is not sufficiently secured. The ratio of Ga in all the metal elements in the first semiconductor layer (IGZO) is preferably greater than or equal to 10 atomic %, more preferably greater than or equal to 15 atomic %, and even more preferably greater than or equal to 20 atomic %. If, on the other hand, the amount of Ga is too large, there may be a case in which on-current in the total oxide semiconductor is decreased due to reduction of carrier density. The ratio of Ga in all the metal elements is thus preferably smaller than or equal to 80 atomic %, more preferably smaller than or equal to 70 atomic %, and even more preferably smaller than or equal to 60 atomic %.

As for the base material components constituting the first oxide semiconductor layer (IGZO), the ratio among the respective metals (In:Ga:Zn) is not particularly limited, so long as it is in the range where oxides containing these metals have amorphous phase and show semiconductor characteristics.

The first oxide semiconductor is preferably composed of, for example, the In:Ga:Zn ratio ranging from 1:1:1 to 2:2:1.

The thin film transistor of the present invention is characterized in that the oxide semiconductor layer is the laminated layers of the second oxide semiconductor layer (IZTO) and the first oxide semiconductor layer (IGZO). The second oxide semiconductor layer (IZTO) is formed on top of a gate insulating film while the first oxide semiconductor layer (IGZO) is interposed between the second oxide semiconductor layer (IZTO) and a passivation film. The second oxide semiconductor layer (IZTO) is liable to form trapping levels arising from oxygen deficiency at the interface with the passivation film, causing deterioration of stability as described above. In the present invention, such a problem is solved by forming the first oxide semiconductor layer (IGZO) between the second oxide semiconductor layer (IZTO) and the passivation film, improving both the TFT characteristics and the stress resistance. Further, high carrier mobility is achieved by putting IZTO having higher mobility than IGZO on the side of gate insulating film, where more current goes through.

Thickness of the second oxide semiconductor layer (IZTO) is not particularly limited. However, if the second oxide semiconductor layer (IZTO) is too thin, then undesirable deviation is liable to arise of the in-plane characteristics of the substrate (TFT characteristics such as mobility, S value, and $V_{th}$). The thickness of the second oxide semiconductor layer is preferably greater than or equal to 3 nm, and more preferably greater than or equal to 5 nm, accordingly. On the other hand, if the second oxide semiconductor layer (IZTO) is too thick, it takes prolonged period of time to deposit the IZTO layer causing the increase of the production cost. The thickness of the second oxide semiconductor layer is preferably smaller than or equal to 200 nm, and more preferably smaller than or equal to 80 nm, accordingly.

Thickness of the first oxide semiconductor layer (IGZO) is not particularly limited. However, if the first oxide semiconductor layer (IGZO) is too thin, then the effect of forming the first oxide semiconductor layer may not be sufficiently exerted. The thickness of the first oxide semiconductor layer is thus preferably greater than or equal to 3 nm, and more preferably greater than or equal to 5 nm. On the other hand, if the first oxide semiconductor layer (IGZO) is too thick, the mobility is liable to decrease. The thickness of the first oxide semiconductor layer is thus preferably smaller than or equal to 100 nm, and more preferably smaller than or equal to 80 nm.

Total thickness of the oxide semiconductor layer consisting of the second oxide semiconductor layer and the first oxide semiconductor layer is not particularly limited as long as each thickness of the second and the first layers is controlled within the ranges described above. However, excessively thick total thickness increases the production cost and hinders reducing the thickness of thin film transistors. The total thickness is thus preferably smaller than or equal to 300 nm, and more preferably smaller than or equal to 200 nm.

While the oxide semiconductor layer characterizing the present invention may be the two-layer structure of the second oxide semiconductor layer (IZTO) and the first oxide semiconductor layer (IGZO) in that order from the side of the gate insulating film, it may also be a three-layer structure by interposing a third oxide semiconductor layer consisting an oxide comprising Ga between the gate insulating film and the second oxide semiconductor layer (IZTO). The three-layer laminated layers are constituted of the third oxide semiconductor (an oxide comprising Ga), the second oxide semiconductor layer (IZTO), and the first oxide semiconductor layer (IGZO) in that order from the side of the gate insulating film. If the gate insulating film is composed of oxide based insulators such as $SiO_2$ as for the protective film group, there may be a case in which stress resistance is deteriorated caused by the deficiency of oxygen at the interface between the gate insulating film and the second oxide semiconductor layer (IZTO), as in the interface with the protective film group. The problem can be solved by interposing the third oxide semiconductor layer (an oxide comprising Ga).

The third oxide semiconductor is thus only necessary to contain at least Ga. It may be for a typical example, In—Ga—Zn—O, the same as the first oxide semiconductor layer, $Ga_2O_3$, Ga—Zn—O, and In—Ga—O. If the third oxide semiconductor is constituted of In—Ga—Zn—O, its chemical composition may be the same as or may be different from that (the ratio of Ga in all the metal elements; the In:Ga:Zn ratio) of the first oxide semiconductor layer (IGZO). If the third oxide semiconductor comprising an oxide containing Ga has the same chemical composition as that of the first oxide semiconductor layer (IGZO), the details of the third oxide semiconductor is the same as the first oxide semiconductor layer.

Thickness of the third oxide semiconductor layer (an oxide containing Ga) is not particularly limited. However, if the third oxide semiconductor layer is too thin, then the effect of forming the third oxide semiconductor layer may not be sufficiently exerted. The thickness of the third oxide semiconductor layer is thus preferably greater than or equal to 3 nm, and more preferably greater than or equal to 5 nm. On the other hand, if the third oxide semiconductor layer (an oxide containing Ga) is too thick, the mobility is liable to decrease. The thickness of the third oxide semiconductor layer is thus preferably smaller than or equal to 50 nm, and more preferably smaller than or equal to 40 nm.

Herein, the higher the total density (average density) of the above oxide semiconductor layers (whole of the first and the second oxide semiconductor layers, or whole of the first to the third oxide semiconductor layers) is, the more preferable. The total density is preferably higher than or equal to $6.0 \text{ g/cm}^3$. If the total density is high, defects in the film are decreased to improve the film quality, the electron field-effect mobility of a TFT element is increased, the electric conductivity becomes high, and the stability is improved. The density is more preferably higher than or equal to $6.1 \text{ g/cm}^3$, and even more preferably higher than or equal to $6.2 \text{ g/cm}^3$.

Figure 2:
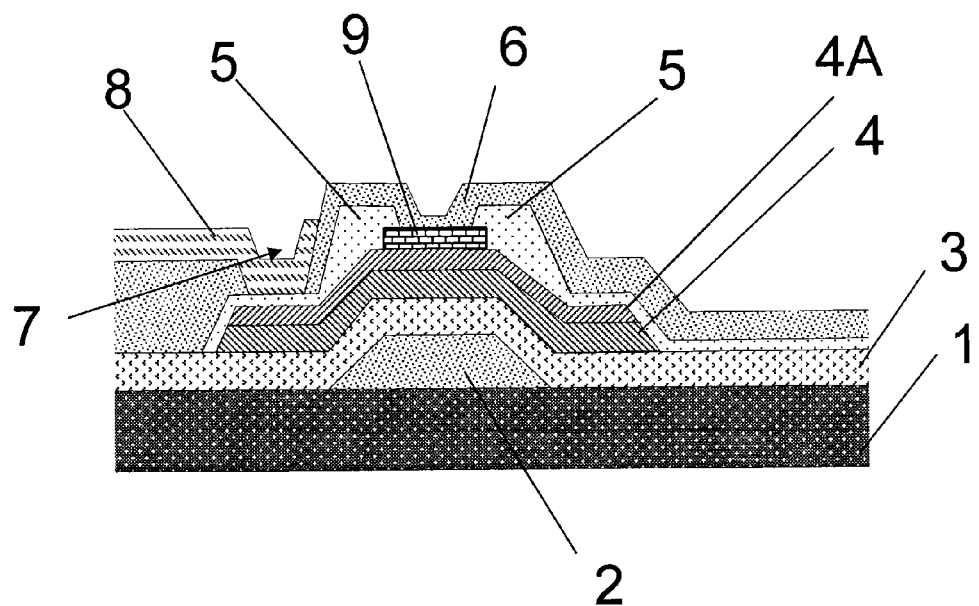
FIG. 2 is a schematic cross-sectional view for explaining an embodiment of a thin film transistor having laminated layers comprising a second oxide semiconductor layer (IZTO, near side from the substrate) and a first oxide semiconductor layer (IGZO, far side from the substrate). It is noted that the thin film transistor comprises an etch stopper layer.
Figure 3:
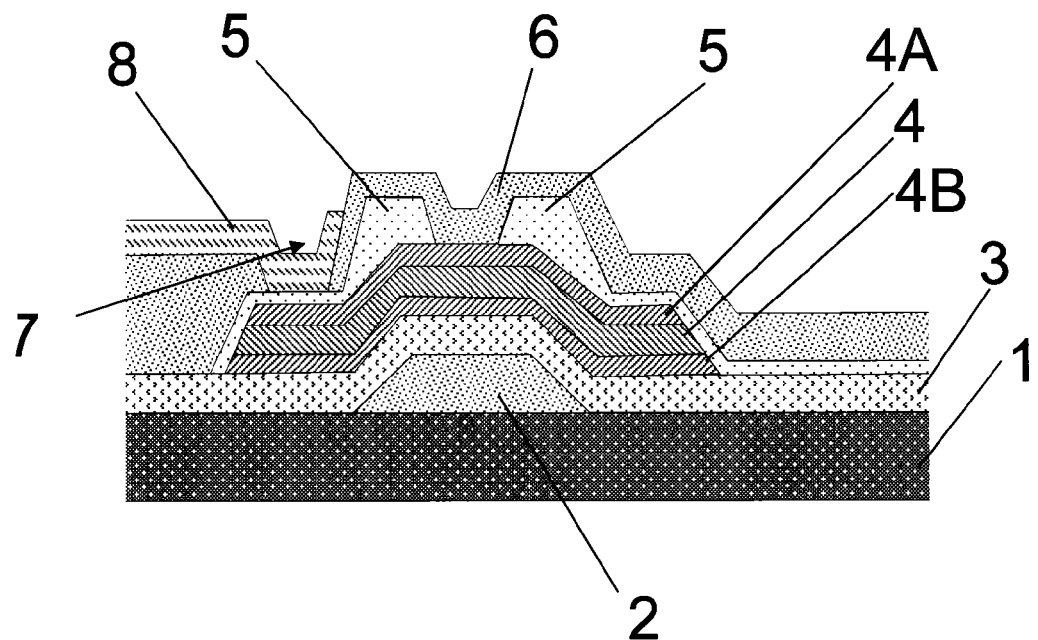
FIG. 3 is a schematic cross-sectional view for explaining another embodiment of a thin film transistor having laminated layers comprising a second oxide semiconductor layer (IZTO, in the middle), a first oxide semiconductor layer (IGZO, far side from the substrate), and a third oxide semiconductor layer (oxide comprising Ga, near side from the substrate). It is noted that the thin film transistor does not comprise an etch stopper layer.
Figure 4:
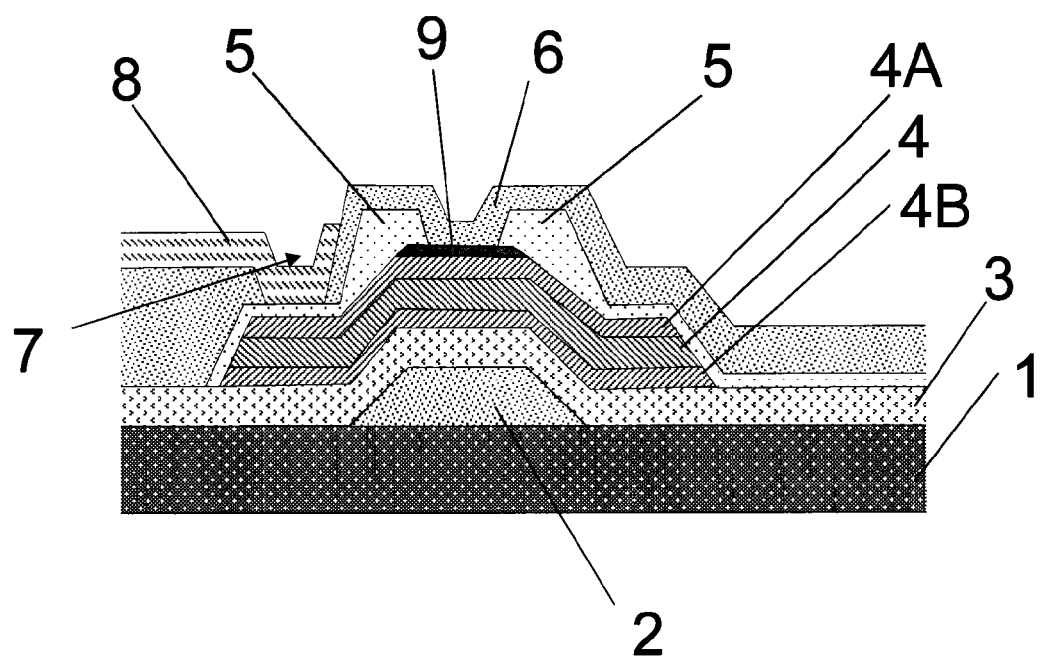
FIG. 4 is a schematic cross-sectional view for explaining another embodiment of a thin film transistor having laminated layers comprising a second oxide semiconductor layer (IZTO, in the middle), a first oxide semiconductor layer (IGZO, far side from the substrate), and a third oxide semiconductor layer (oxide comprising Ga, near side from the substrate). It is noted that the thin film transistor comprises an etch stopper layer.

Next in the following, preferred embodiments of the present invention in which the oxide semiconductor layer is constituted of a laminate of two-layer structure comprising a second oxide semiconductor layer consisting of IZTO and a first oxide semiconductor layer consisting of IGZO (a two-layer structure as shown in FIG. 2 or a three-layer structure as shown in FIGS. 3 and 4) are explained by referring to the figures and the conventional example illustrated in FIG. 1.

FIG. 1 (a conventional example) and FIG. 2 (an example of the present invention) are schematic cross-sectional views for the explanation of a thin film transistor having an oxide semiconductor layer, both of which are examples of etch stopper type provided with an etch stopper layer 9. Although a thin film transistor having an etch stopper layer 9 is exemplified herein, the present invention is not limited to this type of thin film transistor. The present invention is also applicable to a thin film transistor of back-channel etching type without an etch stopper layer 9, such as one shown below in FIG. 3, for example.

Firstly, the oxide semiconductor layer 4C is constituted of a single layer the conventional example. As shown in FIG. 1, the single layer of the oxide semiconductor 4C is in direct contact to the etch stopper layer 9.

On the other hand, FIG. 2 illustrates a preferred embodiment of the present invention in which the oxide semiconductor layer is constituted of a laminate of two-layer structure comprising a second oxide semiconductor layer (IZTO) 4 and a first oxide semiconductor layer (IGZO) 4A. The first oxide semiconductor layer (IGZO) 4A is formed between the second oxide semiconductor layer (IZTO) 4 and a passivation film 6. The first oxide semiconductor layer (IGZO) 4A is configured to be in direct contact to an etch stopper layer 9.

FIGS. 3 and 4 are examples of preferred embodiments in which the oxide semiconductor layer has a three-layer structure. The thin film transistors in these figures comprise a third oxide semiconductor layer 4B comprising Ga between a gate insulating film 3 and a second oxide semiconductor layer 4 (IZTO) in addition to the two layer structure shown in FIG. 2 which is consisting of the second oxide semiconductor layer 4 (IZTO) and the first oxide semiconductor layer 4A (IGZO) in that order from the side of the gate insulating film.

Among them, FIG. 3 illustrates a structure of a back-channel etch type transistor without an etch stopper layer 9, in which a first oxide semiconductor layer 4A is formed between a second oxide semiconductor layer (IZTO) 4 and a passivation film so that the IGZO layer is in direct contact to the passivation film 6. On the other hand, FIG. 4 shows a structure of an etch stopper type transistor with an etch stopper layer 9, in which a first oxide semiconductor layer 4A is formed between the second oxide semiconductor layer (IZTO) 4 and a passivation film so that the IGZO layer is in direct contact to the etch stopper layer 9. As described above, the third oxide semiconductor layer 4B (oxide comprising Ga) is formed between the second oxide semiconductor layer (IZTO) 4 and the gate insulating film 3 in both FIG. 3 and FIG. 4. If the gate insulating film 3 is an oxide based insulating film, it is recommended that the IZTO (the second oxide semiconductor layer 4) is in between the oxide layer comprising Ga (the third oxide semiconductor layer 4B) and the IGZO (the first oxide semiconductor layer 4A) to form a three-layer structure as shown in FIG. 3 and FIG. 4.

The above is the explanation of the oxide semiconductor layer to be used in the present invention.

The second oxide semiconductor layer consisting of IZTO and the first oxide semiconductor layer consisting of IZGO, and further the third oxide semiconductor layer consisting of an oxide containing Ga as described above, may preferably be formed by a sputtering method using a sputtering target (which may hereinafter be referred to as the "target"). The sputtering method facilitates formation of a thin film having excellent in-plane uniformity in terms of chemical composition and film thickness. The oxide can also be formed by a chemical film-formation method such as a coating method.

As a target to be used in the sputtering method, there may preferably be used a sputtering target containing the elements described above and having the same composition as that of a desired oxide, thereby making it possible to form a thin film showing small deviation of composition and having the same composition as that of the desired oxide.

Specifically, as the target for depositing the second oxide semiconductor layer (IZTO), an oxide target consisting of In, Zn, and Sn can be used.

As the target for forming the first oxide semiconductor layer (IGTO), an oxide target consisting of In, Ga, and Zn can be used.

As the target for forming the third oxide semiconductor layer, an oxide target containing Ga can be used. In case that the third oxide semiconductor layer is constituted of In, Ga, Zn, and O as for the above-described first semiconductor layer (IGZO), an oxide target constituted of In, Ga, and Zn can be preferably used according to the composition.

The oxide semiconductor layers may preferably be formed successively, while keeping under vacuum, by the sputtering method. This is because exposure to air in the formation of the oxide semiconductor layers leads to the adsorption of water or organic substances from the air to the thin film surface, which leads to the contamination (quality failure).

Each of the targets as described above can be produced, for example, by a powder sintering method.

The sputtering using a target as described above may preferably be carried out under the conditions that substrate temperature is set to a range of approximately from room temperature to 200° C. and amount of oxygen is appropriately controlled. The amount of oxygen may appropriately be controlled according to the configuration of a sputtering system and the composition of the target. The amount of oxygen may preferably be controlled by the addition of oxygen so that the carrier concentration of a semiconductor becomes approximately from $10^{15}$ to $10^{16}$ cm$^{-3}$. Furthermore, to form a film of such an oxide, the sputtering conditions may preferably be controlled in an appropriate manner, such as gas pressure, input power to be applied to a sputtering target, and T-S distance (the distance between the sputtering target and the substrate), to adjust the density of the oxide semiconductor layer. For example, when the gas pressure is lowered during film formation, sputtered atoms can be prevented from scattering one another, thereby making it possible to form a dense (high-density) film. Thus, the total gas pressure during film formation may preferably be in a range of approximately from 1 to 3 mTorr. Furthermore, the input power may preferably be as low as possible, and it is recommended to be set to about 2.0 W/cm$^2$ or higher in DC or RF mode.

The density of each of the oxide is influenced by the conditions of heat treatment after the film formation, and therefore, the conditions of heat treatment after the film formation may preferably be controlled in a proper manner. For example, the heat treatment after the film formation may be preferably conducted at roughly 250 to 400° C. for 10 minutes to about 3 hours in an air atmosphere. Such heat treatment can also be controlled, for example, in the heat history during the production process of TFTs. For example, the pre-annealing treatment (heat treatment carried out just after the patterning subsequent to the wet etching of the oxide semiconductor layer) increases the density of each of the oxide layers.

The thin film transistor of the present invention is characterized in that the TFT comprises the two-layer or three-layer laminate structure. Other than that, structural elements including a gate insulating film are not particularly limited. A gate electrode, a gate insulating film, a source electrode, a drain electrode (a source electrode and a drain electrode are occasionally referred collectively to a source-drain electrode in the present invention), and a passivation film or an etch stopper layer; are not particularly limited as long as they are those usually used in the field of TFT.

The passivation film is formed on the upper side of the source-drain electrode as shown in FIGS. 1 to 4. It is formed for the purpose of protecting the gate insulating film, the oxide semiconductor layer, and the source-drain electrode.

The following explains, by referring to FIG. 4, embodiments of a method for fabricating a TFT according to the present invention. The TFT structure shown in FIG. 4 and the method described below indicate one example of the preferred embodiments of the present invention, in which the oxide semiconductor layer has a three-layer structure consisting of a third oxide semiconductor comprising Ga 4B, a second oxide semiconductor (IZTO) 4, and a first oxide semiconductor (IGZO) 4A, in that order from the side of substrate; but they are not intended to limit the present invention. For example, FIG. 4 shows a TFT having the three-layer oxide semiconductor structure; however, the present invention is not limited thereto, and the TFTs of the present invention may be a TFT having a two-layer structure as shown in FIG. 2. Further, FIGS. 2 to 4 for example show a TFT having a bottom gate type structure; however, the present invention is not limited thereto, and the TFTs of the present invention may be a top gate type TFT having, in a following order from the substrate side (upper side), a gate electrode, a gate insulating film, a oxide semiconductor layer, a source-drain electrode, and a passivation film on the bottom side to protect the source-drain electrode. In the top gate type TFT, a first oxide semiconductor (IGZO) layer may be interposed between the second oxide semiconductor (IZTO) layer and the passivation film. A third oxide semiconductor comprising Ga may further be interposed between the second oxide semiconductor (IZTO) layer and the passivation film.

As shown in FIG. 4, a gate electrode 2 and a gate insulator layer 3 are formed on a substrate 1, and a third oxide semiconductor layer consisting of a Ga-containing oxide 4B, a second oxide semiconductor layer (IZTO) 4, and a first oxide semiconductor layer (IGZO) 4A are formed thereon. A source-drain electrode 5 is formed on the first oxide semiconductor layer (IGZO) 4A, and an etch stopper layer 9 and a passivation layer (or insulator layer) 6 are formed thereon, and a transparent conductive film 8 is electrically connected to the drain electrode 5 through a contact hole 7.

The method of forming the gate electrode 2 and the gate insulator layer 3 on the substrate 1 is not particularly limited, and any of the methods usually used can be employed. The kinds of the gate electrode 2 and the gate insulator layer 3 are not particularly limited, and there can be used those which have widely been used. For example, metals such as Mo, Al, Cu, and their alloys, can preferably be used for the gate electrode 2. Typical examples of the gate insulator layer 3 may include a silicon nitride (SiN) film, a silicon oxide ($SiO_2$) film, and a silicon oxynitride (SiON) film. In addition, there can also be used oxides such as $Al_2O_3$ and $Y_2O_3$, and those which are formed by layering them.

Then, the oxide semiconductor layers are deposited in the order of the third oxide semiconductor layer consisting of a Ga-containing oxide 4B, the second oxide semiconductor layer (IZTO) 4, and the first oxide semiconductor layer (IGZO) 4A.

Among the layers, the first oxide semiconductor layer (IGZO) 4A and the third oxide semiconductor layer 4B may preferably be deposited by a DC sputtering method or an RF sputtering method using a sputtering target having Ga constituting the first oxide semiconductor layer 4A, preferably In—Ga—Zn—O.

The second oxide semiconductor layer (IZTO) 4 may be deposited in a similar manner by a DC sputtering method or an RF sputtering method using an oxide sputtering target having In, Zn, and Sn. It is preferred that the third oxide semiconductor layer 4B, the second oxide semiconductor layer 4, and the first oxide semiconductor layer 4A are successively deposited in that order in an vacuum environment. The chemical composition of the second oxide semiconductor (IZTO) is preferably controlled so that it satisfies either the expression (1) or the expression (2) to improve the sputtering rate and the TFT characteristics. It is preferably controlled so that it further satisfies the expression (3) to improve the wet etching property.

The oxide semiconductor layer of the above-described structure is subjected to wet etching and then patterning. Just after the patterning, heat treatment (pre-annealing) may preferably be carried out for the purpose of improving the quality of the oxide semiconductor layer, resulting in an increase in the on-state current and field-effect mobility as the transistor characteristics and an improvement in the transistor performance. The pre-annealing conditions may be, for example, such that the temperature is from about 250° C. to about 400° C. and the time is from about 10 minutes to 1 hour.

After the pre-annealing, an etch stopper layer 9 may be formed. The kind of the etch stopper layer 9 is not particularly limited, but those which have widely been used may be employed. When the source-drain electrode is subjected to etching, there is fear that the oxide semiconductor layer is damaged to deteriorate transistor characteristics. In such a case, the etch stopper layer 9 may preferably be formed.

However, depending on the production method, there are cases in which the oxide semiconductor layer is not damaged, even if the etch stopper layer 9 is not provided. Therefore, the etch stopper layer 9 may be formed, if necessary. For example, when the source-drain electrode is processed by a lift-off method, the etch stopper layer 9 is not necessary because of no damage on the semiconductor layer (see back-channel etch type illustrated in FIG. 3).

The kind of the source-drain electrode 5 is not particularly limited, and there can be used those which have widely been used. For example, similarly to the gate electrode, metals such as Mo, Al and Cu or their alloys may be used. A sputtering method is widely used for the formation of the electrode.

Then, the passivation layer 6 is formed on the source-drain electrode 5 by a CVD (Chemical Vapor Deposition) method. For the passivation layer 6 to be formed by the CVD method, there can be used, for example, $SiO_2$, SiN and SiON. The passivation layer 6 may also be formed using a sputtering method.

The surface of the semiconductor layer may easily become conductive due to plasma-induced damage by CVD (presumably because oxygen defects formed on the surface of the first oxide semiconductor act as electron donors), and therefore, $N_2O$ plasma irradiation was carried out before the formation of the passivation layer 6 in Examples described below. The conditions described in the following literature document were employed as the $N_2O$ plasma irradiation conditions.

J. Park et al., Appl. Phys. Lett., 1993, 053505 (2008)

Then, according to a conventional method, the transparent conductive film 8 is electrically connected to the drain electrode 5 through the contact hole 7. The kinds of the transparent conductive film 8 and drain electrode 5 are not particularly limited, and there can be used those which have usually been used. For the drain electrode 5, there can be used, for example, materials exemplified for the source-drain electrode described above.

The present application claims the benefit of priority based on Japanese Patent Application No. 2012-107813 filed on May 9, 2012. The entire contents of the specification of Japanese Patent Application No. 2012-107813 filed on May 9, 2012 are incorporated herein by reference.

EXAMPLES

The present invention is described hereinafter more specifically by way of Examples, but the present invention is not limited to the following Examples. The present invention can be put into practice after appropriate modifications or variations within a range meeting the gist described above and below, all of which are included in the technical scope of the present invention.

According to a method as described above, TFTs having an oxide semiconductor layer of different structures including conventional single layer oxide semiconductor layer as shown in FIG. 1, two-layer oxide semiconductor with an etch stopper layer as shown in FIG. 2, and three-layer oxide semiconductor with an etch stopper layer as shown in FIG. 4 were fabricated, and TFT characteristics before and after the formation of a passivation layer or an etch stopper layer were evaluated.

First, a Mo thin film of 100 nm in thickness as a gate electrode 2 and $SiO_2$ (200 nm) as a gate insulator layer 3 were successively formed on a glass substrate 1 ("EAGLE 2000" available from Corning Incorporated, having a diameter of 100 mm and a thickness of 0.7 mm). The gate electrode 2 was deposited using a pure Mo sputtering target by a DC sputtering method under the conditions: deposition temperature, room temperature; plasma power density, 3.8 $W/cm^2$; carrier gas, Ar; gas pressure, 2 mTorr; and gas flow rate, 20 sccm. Further, the gate insulator layer 3 was formed by a plasma CVD method under the conditions: carrier gas, a mixed gas of SiH$_4$ and N$_2$O; film formation power, 1.27 W/cm$^3$; film formation gas pressure, 133 Pa; and film formation temperature, 320° C.

Then, oxide semiconductor layers having various compositions and structures as described in Tables 1 and 2 were deposited by a sputtering method under the conditions described below using sputtering targets having chemical compositions corresponding to the compositions of the oxide semiconductor layers. Tables 1 and 2 share the common sample No. and thus a sample No. indicates the same oxide semiconductor layer in both of the Tables. Chemical composition of each of the second semiconductor (IZTO) layer is shown in Table 1. Shown in Table 2 are chemical composition and thickness of each of the first semiconductor (IGZO) layer, thickness of each of the second semiconductor (IZTO) layer, and thickness of the third semiconductor (IGZO) layer for those having the third layer.

Specifically, No. 1 is a conventional example having a structure of single oxide semiconductor layer as shown in FIG. 1. An amorphous oxide semiconductor IZTO single layer (In:Zn:Sn=20:57:23 in atomic % ratio) was deposited as the oxide semiconductor layer 4C on a gate insulating film 3. The first oxide semiconductor (IGZO) layer 4A was not deposited in No. 1.

Nos. 2 to 4, 6 to 11, 15 to 18 are examples having an oxide semiconductor layer of two-layer structure shown in FIG. 2. After depositing s second oxide semiconductor layer 4 of IZTO having the same atomic % ratio as sample No. 1 on a gate insulating film 3, a first oxide semiconductor layer 4A of IGZO (see Table 2 for chemical composition) was deposited.

No. 5 is another example having the structure of single oxide semiconductor layer as shown in FIG. 1. A first oxide semiconductor IGZO single layer (In:Ga:Zn=1:1:1 in atomic % ratio) was deposited as the oxide semiconductor layer 4C on a gate insulating film 3.

Nos. 12 to 14 are examples having the three-layer structure of oxide semiconductor as shown in FIG. 4. A oxide semiconductor layer of the three-layer structure was formed by depositing a third oxide semiconductor layer 4B having the same chemical composition as the first oxide semiconductor, and a second oxide semiconductor 4 of IZTO having the same atomic % ratio as that of No. 1, followed by deposition of a first oxide semiconductor layer 4A of IGZO (see Table 2 for the chemical composition).

Each of the oxide semiconductor layers were deposited by using IZTO and IGZO sputtering targets having chemical compositions corresponding to those shown in Tables 1 and 2 (IZTO for the second oxide semiconductor layer, and IGZO for the first and the third semiconductor layers). In the present examples, a high sputtering rate of equal to or greater than 1.5 Å/sec was realized in those which satisfy either the expression (1) or (2) (see Tables 1 and 2 for the satisfying/unsatisfying). The sputtering rate (not shown in the tables) is not intended to limit the present invention as it significantly different depending on sputtering apparatus and deposition conditions.

The two-layer structure having the second oxide semiconductor layer (IZTO) 4 and the first oxide semiconductor layer (IGZO) 4A, and the three-layer structure further having the third oxide semiconductor layer (oxide comprising Ga) 4B were successively formed without opening the chamber to the air. The respective contents of metal elements in each of the oxide semiconductor layers thus obtained were analyzed by an XPS (X-ray photoelectron spectroscopy) method.

The second oxide semiconductor layer (IZTO) 4, the first oxide semiconductor layer (IGZO) 4A, and the third oxide semiconductor layer consisting of a Ga-containing oxide 4B were formed by a sputtering method. The apparatus used in the sputtering was "CS-200" available from ULVAC, Inc., and the sputtering conditions were as follows:

Substrate temperature: room temperature
Gas pressure: 1 mTorr
Oxygen partial pressure: O$_2$/(Ar+O$_2$)=4%
Film formation power: 2.55 W/cm$^2$ After the oxide semiconductor layers were deposited as described above, patterning was carried out by photolithography and wet etching. "ITO-07N" available from Kanto Chemical Co., Inc. was used as a wet etchant. It was confirmed in the present example that oxide semiconductor layer samples which satisfy the expression (3) (see Table 1) were properly wet-etched without residues. For those which satisfy the expression (3), it was confirmed that each of the oxide semiconductor layer in the TFT was properly etched without a significant level difference due to difference in etching rates between the first and the second oxide semiconductors (difference in etching rates among the first, the second and the third oxide semiconductors in case the TFT comprised the third oxide semiconductor). On the contrary, those which do not satisfy the expression (3) showed degradation in terms of wet etching property. For reference, a column for wet etching property is included in Table 3 to indicate "good" or "poor" for each of the samples.

After patterning of each oxide semiconductor layer, pre-annealing treatment was carried out to improve the film quality. The pre-annealing was carried out at 350° C. under air atmosphere for 1 hour.

Next, a silicon oxide (SiO$_x$) film was formed by a plasma CVD method as an etch stopper layer 9 on the channel layer. Specifically, the deposition conditions were as follows: substrate temperature: 200° C., input power: RF 100 W, carrier gas: mixed gas of SiH$_4$ and N$_2$O. The deposition was conducted using the same apparatus used for the formation of an gate insulator film.

Then, a source-drain electrode 5 was formed by a lift-off method using pure Mo. More specifically, after patterning was carried out using a photoresist, a Mo thin film was deposited by a DC sputtering method (the film thickness was 200 nm). The deposition conditions were as follows; input power: DC 300 W, gas pressure: 2 mTorr, substrate temperature: room temperature. The electrode was patterned by photolithography, and a mixed-acid etchant (a mixed solution of phosphoric acid, nitric acid, and acetic acid) was used for the wet etching of the Mo thin film. For each TFT, the channel length was set to 10 μm and the channel width was set to 25 μm.

After the source-drain electrode 5 was formed as described above, a passivation layer 6 was formed on top of the electrode 5. As the passivation layer 6, a stacked product (350 nm in total thickness) of SiO$_2$ (200 nm in thickness) and SiN (150 nm in thickness) was used. The SiO$_2$ and SiN layers were formed by a plasma CVD method using "PD-220NL" available from SAMCO Inc. In the present Examples, the SiO$_2$ layer and the SiN layer was successively formed after making plasma treatment with N$_2$O gas. A mixed gas of N$_2$O and SiH$_4$ was used for the deposition of the SiO$_2$ layer, and a mixed gas of SiH$_4$, N$_2$, and NH$_3$ was used for the deposition of the SiN layer. In both cases, the film deposition power was set to 100 W, and the film deposition temperature was set to 150° C.

Subsequently, a contact hole 7 to be used for probing to evaluate transistor characteristics was formed in the passivation layer 6 by photolithography and dry etching. Then, an ITO film (80 nm in thickness) was formed as a transparent conductive film 8 by a DC sputtering method under the conditions: carrier gas, a mixed gas of argon gas and oxygen gas;

film deposition power, 200 W; and gas pressure, 5 mTorr. Thus, TFTs shown in FIG. 1 (Nos. 1, 5), FIG. 2 (Nos. 2-4, 6-11, 15-18), and FIG. 4 (Nos. 12-14) were prepared.

Each TFT obtained as described above was subjected to evaluations as follows regarding (1) transistor characteristics (drain current $I_d$-gate voltage characteristics $V_g$ characteristics), (2) threshold voltage, (3) field-effect mobility, and (4) stress resistance (light irradiation and negative bias were applied as stress).

(1) Measurement of Transistor Characteristics

Figure 5A:
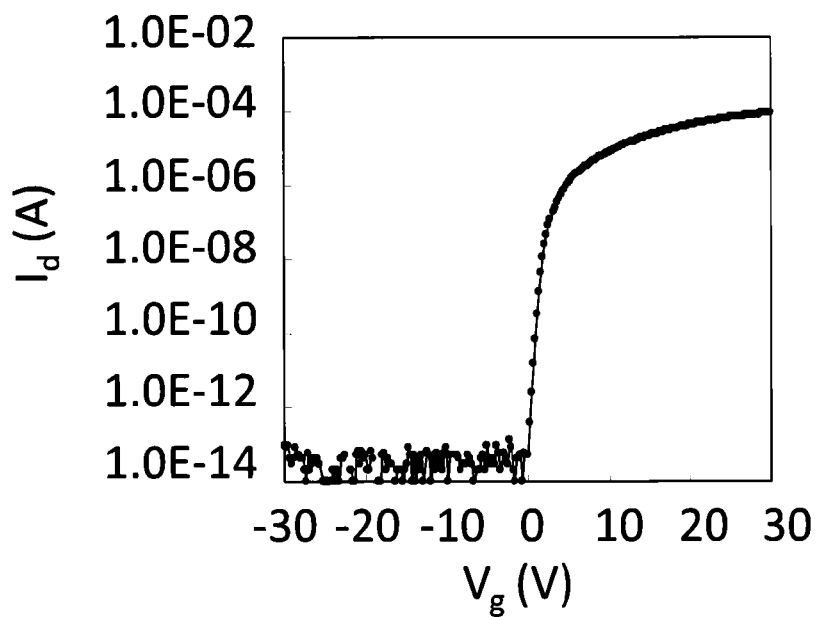
FIG. 5A shows the $I_d$-$V_g$ characteristics of a TFT using IZTO single layer film for the oxide semiconductor layer as a conventional example (No. 1).
Figure 5B:
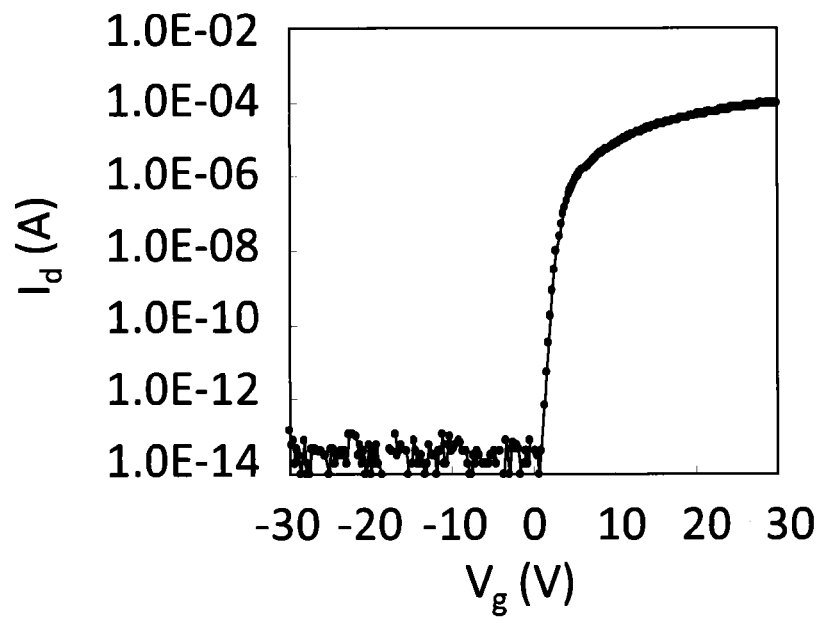
FIG. 5B shows the $I_d$-$V_g$ characteristics of a TFT using IGZO and IZTO having laminated layers (two-layer structure) for the oxide semiconductor layer.

The transistor characteristics (drain current-gate voltage characteristics ($I_d$-$V_g$ characteristics)) were measured using a semiconductor parameter analyzer "4156C" available from Agilent Technology. The detailed measurement conditions were as follows:

Source voltage: 0 V
Drain voltage: 10 V
Gate voltage: from −30 to 30 V (measurement interval: 0.25 V)
Substrate temperature: room temperature Also, for a portion of the examples, the resulting drain current-gate voltage characteristics ($I_d$-$V_g$ characteristics) are shown in FIG. 5A (No. 1) and FIG. 5B (No. 2).

(2) Threshold Voltage ($V_{th}$)

The threshold voltage is roughly a value of gate voltage at the time when a transistor is shifted from off-state (state where drain current is low) to on-state (state where drain current is high). In this example, the voltage in the case where the drain current is over 1 nA between on-current and off-current is defined as the threshold voltage, and the threshold voltage of each TFT was measured. In this example, the pass criterion was that $V_{th}$ (absolute value) is −5 V or more. Notation "-" in the Table indicates that the TFT did not show switching in the measurement range of bias from −30 to 30 V, i.e., the TFT became conductive.

(3) Carrier Mobility (Field-Effect Mobility $\mu_{FE}$)

The carrier mobility (field-effect mobility $\mu_{FE}$) was derived in the saturation region where $V_d > V_g - V_{th}$ from the TFT characteristics. In the saturation region, the filed-effect mobility $\mu_{FE}$ is derived by the expression described below, in which $V_g$ and $V_{th}$ are the gate voltage and the threshold voltage, respectively; $I_d$ is the drain current; L and W are the channel length and channel width of a TFT element, respectively; $C_i$ is the capacitance of the gate insulator layer; and $\mu_{FE}$ is the field-effect mobility. In the present Example, the field-effect mobility $\mu_{FE}$ was derived from the drain current-gate voltage characteristics ($I_d$-$V_g$ characteristics) around gate voltages falling in the saturation region.

[Expression 1]

$$\mu_{FE} = \frac{\partial I_d}{\partial V_g}\left(\frac{L}{C_i W(V_d - V_{th})}\right) \quad \text{(Expression 1)}$$

In the present Example, the pass criterion was that the field-effect mobility is less than 14 cm²/Vs ($\mu_{FE}$ of No. 1 sample (17.5 cm²/Vs) times 0.8) or more.

(4) Evaluation of Stress Resistance (Light Irradiation and Negative Bias were Applied as Stress)

In the present Examples, stress application tests were carried out by light irradiation while applying negative bias to the gate electrode for simulation of environments (stress) at the time of actual panel drive. The stress application conditions were as described below. As the wavelength of light, about 400 nm was selected, which is near the band gaps of oxide semiconductors and at which transistor characteristics may easily vary.

Source voltage: 0 V
Drain voltage: 10 V
Gate voltage: −20 V
Substrate temperature: 60° C.
Light stress
Wavelength: 400 nm
Illuminance (intensity of light irradiated onto TFTs): 0.1 μW/cm²
Light source: LED available from OPTOSUPPLY Ltd. (light intensity was adjusted with an ND filter)
Stress application time: 2 hours Specifically, the threshold voltages ($V_{th}$) before and after the stress tests were measured using the technique described above, and a difference therebetween ($\Delta V_{th}$) was determined. In the present Example, the pass criterion was that the threshold voltage shift (the absolute value of $\Delta V_{th}$) is less than −2.2 V ($\Delta V_{th}$ of No. 1 sample (−2.8 V) times 0.8).

These results are shown in Table 3. In a column "Total judgment of (2) to (4)*" in Table 3, samples that satisfy all the criteria regarding (2) threshold voltage, (3) mobility, and (4) threshold voltage shift are indicated "pass" while those do not satisfy at least one of the criteria (2) to (4) are indicated as "fail".

TABLE 1

| | | | | | | Composition of the second oxide semiconductor layer (IZTO) | | | | | |
|---|---|---|---|---|---|---|---|---|---|---|---|
| No. | Remarks | [In] | [Zn] | [Sn] | [In]/ ([In] + [Zn]+ [Sn]) | Left side value of expressions (1) and (2): [In]/([In] + [Zn]+ [Sn]) | Right side value of atomic ratio of expression (1): [Zn]/([Zn]+ [Sn]) | Left side value of expression (3): [Zn]/([In] + [Zn]+ [Sn]) | Right side value of expression (1) | Relation of expression (1) | Relation of expression (2) | Relation of expression (3) |
| 1 | Conventional example (single layer) | 20 | 57 | 23 | 0.47 | 0.20 | 0.71 | 0.57 | 0.50 | Satisfied | — | Satisfied |
| 2 | Two-layer (i) | 20 | 57 | 23 | 0.47 | 0.20 | 0.71 | 0.57 | 0.50 | Satisfied | — | Satisfied |
| 3 | Two-layer (i) | 20 | 57 | 23 | 0.47 | 0.20 | 0.71 | 0.57 | 0.50 | Satisfied | — | Satisfied |
| 4 | Two-layer (i) | 20 | 57 | 23 | 0.47 | 0.20 | 0.71 | 0.57 | 0.50 | Satisfied | — | Satisfied |
| 5 | Conventional example (single layer) | — | — | — | — | — | — | — | — | — | — | — |
| 6 | Two-layer (i) | 21 | 52 | 27 | 0.44 | 0.21 | 0.66 | 0.52 | 0.42 | Satisfied | — | Satisfied |
| 7 | Two-layer (i) | 18 | 45 | 37 | 0.33 | 0.18 | 0.55 | 0.45 | 0.27 | Satisfied | — | Satisfied |

TABLE 1-continued

Composition of the second oxide semiconductor layer (IZTO)

| No. | Remarks | [In] | [Zn] | [Sn] | [In]/ ([In] + [Zn] + [Sn]) | Left side value of expressions (1) and (2): [In]/([In] + [Zn] + [Sn]) | Right side value of atomic ratio of expression (1): [Zn]/([Zn] + [Sn]) | Left side value of expression (3): [Zn]/([In] + [Zn] + [Sn]) | Right side value of expression (1) | Relation of expression (1) | Relation of expression (2) | Relation of expression (3) |
|---|---|---|---|---|---|---|---|---|---|---|---|---|
| 8 | Two-layer (ii) | 24 | 58 | 18 | 0.57 | 0.24 | — | 0.58 | — | — | Satisfied | Satisfied |
| 9 | Two-layer (ii) | 29 | 44 | 27 | 0.52 | 0.29 | — | 0.44 | — | — | Satisfied | Satisfied |
| 10 | Two-layer (i) | 29 | 38 | 33 | 0.47 | 0.29 | 0.54 | 0.38 | 0.25 | Unsatisfied | — | Satisfied |
| 11 | Two-layer (i) | 29 | 31 | 40 | 0.42 | 0.29 | 0.44 | 0.31 | 0.11 | Unsatisfied | — | Satisfied |
| 12 | Three-layer (i) | 21 | 52 | 27 | 0.44 | 0.21 | 0.66 | 0.52 | 0.42 | Satisfied | — | Satisfied |
| 13 | Three-layer (i) | 18 | 45 | 37 | 0.33 | 0.18 | 0.55 | 0.45 | 0.27 | Satisfied | — | Satisfied |
| 14 | Three-layer (ii) | 24 | 58 | 18 | 0.57 | 0.24 | — | 0.58 | — | — | Satisfied | Satisfied |
| 15 | Two-layer (ii) | 8 | 85 | 7 | 0.53 | 0.08 | — | 0.85 | — | — | Satisfied | Unsatisfied |
| 16 | Two-layer (ii) | 35 | 54 | 11 | 0.76 | 0.35 | — | 0.54 | — | — | Unsatisfied | Satisfied |
| 17 | Two-layer (i) | 11 | 36 | 53 | 0.17 | 0.11 | 0.40 | 0.36 | 0.07 | Unsatisfied | — | Satisfied |
| 18 | Two-layer (i) | 10 | 35 | 55 | 0.15 | 0.10 | 0.39 | 0.35 | 0.04 | Unsatisfied | — | Satisfied |

Two-layer (i): Example of a two-layer structure consisting of IZTO and IGZO in that order from the side of the gate insulator layer, wherein [In]/([In] + [Sn]) is 0.50 or less in the IZTO layer.
Two-layer (ii): Example of a two-layer structure consisting of IZTO and IGZO in that order from the side of the gate insulator layer, wherein [In]/([In] + [Sn]) is more than 0.50 in the IZTO layer.
Three-layer (i): Example of a two-layer structure consisting of IGZO, IZTO, and IGZO in that order from the side of the gate insulator layer, wherein [In]/([In] + [Sn]) is 0.50 or less in the IZTO layer.
Three-layer (i): Example of a two-layer structure consisting of IGZO, IZTO, and IGZO in that order from the side of the gate insulator layer, wherein [In]/([In] + [Sn]) is more than 0.50 in the IZTO layer.

TABLE 2

| No. | Remarks | The second oxide semiconductor layer (IGZO) Ratio of In:Ga:Zn | Thickness (nm) | Thickness of the second oxide semiconductor layer (IZTO) (nm) | Thickness of the third oxide semiconductor layer (IGZO) (nm) |
|---|---|---|---|---|---|
| 1 | Conventional example (single layer) | — | — | 40 | — |
| 2 | Two-layer (i) | 1:1:1 | 5 | 35 | — |
| 3 | Two-layer (i) | 1:1:1 | 20 | 20 | — |
| 4 | Two-layer (i) | 1:1:1 | 30 | 10 | — |
| 5 | Conventional example (single layer) | 1:1:1 | 40 | — | — |
| 6 | Two-layer (i) | 1:1:0.8 | 5 | 35 | — |
| 7 | Two-layer (i) | 1:1:0.8 | 5 | 35 | — |
| 8 | Two-layer (ii) | 1:1:0.8 | 5 | 35 | — |
| 9 | Two-layer (ii) | 1:1:0.8 | 5 | 35 | — |
| 10 | Two-layer (i) | 1:1:0.8 | 5 | 35 | — |
| 11 | Two-layer (i) | 1:1:0.8 | 5 | 35 | — |
| 12 | Three-layer (i) | 1:1:0.8 | 5 | 35 | 5 |
| 13 | Three-layer (i) | 1:1:0.8 | 5 | 35 | 5 |
| 14 | Three-layer (ii) | 1:1:0.8 | 5 | 35 | 5 |
| 15 | Two-layer (ii) | 1:1:0.8 | 5 | 35 | — |
| 16 | Two-layer (ii) | 1:1:0.8 | 5 | 35 | — |
| 17 | Two-layer (i) | 1:1:0.8 | 5 | 35 | — |
| 18 | Two-layer (i) | 1:1:0.8 | 5 | 35 | — |

Thickness and chemical composition of the third oxide semiconductor layer of Nos. 11 to 13 are the same as those of the second oxide semiconductor layer.

TABLE 3

| No. | Remarks | (2) Threshold voltage $V_{th}$ (V) | (3) Mobility ($Cm^2/Vs$) | (4) Threshold voltage shift ($\Delta V_{th}$) (V) | Total judgment of (2) to (4)* | Wet etching property |
|---|---|---|---|---|---|---|
| 1 | Conventional example (single layer) | 1.5 | 17.5 | −2.8 | fail | good |
| 2 | Two-layer (i) | 2.8 | 18.1 | −1.0 | pass | good |
| 3 | Two-layer (i) | 3.0 | 17.2 | −0.8 | pass | good |
| 4 | Two-layer (i) | 2.7 | 15.3 | −0.7 | pass | good |
| 5 | Conventional example (single layer) | 2.0 | 6.8 | −0.9 | fail | good |

TABLE 3-continued

| No. | Remarks | (2) Threshold voltage $V_{th}$ (V) | (3) Mobility ($Cm^2$/Vs) | (4) Threshold voltage shift ($\Delta V_{th}$) (V) | Total judgment of (2) to (4)* | Wet etching property |
|---|---|---|---|---|---|---|
| 6 | Two-layer (i) | 2.8 | 18.1 | −1.3 | pass | good |
| 7 | Two-layer (i) | 2.2 | 17.5 | −1.4 | pass | good |
| 8 | Two-layer (ii) | 1.5 | 20.5 | −1.1 | pass | good |
| 9 | Two-layer (ii) | 1.3 | 19.4 | −1.4 | pass | good |
| 10 | Two-layer (i) | −16 | 12.3 | — | fail | good |
| 11 | Two-layer (i) | −22 | 15.2 | — | fail | good |
| 12 | Three-layer (i) | 2.5 | 19.1 | −0.9 | pass | good |
| 13 | Three-layer (i) | 1.8 | 17.7 | −0.7 | pass | good |
| 14 | Three-layer (ii) | 1.9 | 21.8 | −0.8 | pass | good |
| 15 | Two-layer (ii) | 2.0 | 15.5 | −1.8 | pass | poor |
| 16 | Two-layer (ii) | −17 | 11.3 | — | fail | good |
| 17 | Two-layer (i) | TFT became conductive and unmeasurable | | | fail | good |
| 18 | Two-layer (i) | TFT became conductive and unmeasurable | | | fail | good |

"Total judgment*": samples that satisfy all the criteria (2) to (4) are indicated "pass" while those do not satisfy at least one of the criteria (2) to (4) are indicated as "fail".

Nos. 2 to 4, 6 to 9, and 12 to 14 are examples in which the IZTO satisfies the expression (1) or (2) defined in the present invention, and therefore, showed excellent characteristics regarding (2) to (4) as described above. Further, the IZTO satisfies the expression (3) defined in the presentation in these examples, and therefore, had excellent wet etching property.

No. 15 is a comparative example supporting the necessity of satisfying the expression (3) defined in the present invention in order to implement the improvement of wet etching property which is a technical problem to be preferably solved. No. 15 satisfies the expression (2) defined in the present invention, and therefore showed excellent characteristics regarding (2) to (4) as described above. The sample may be thus categorized to one of examples of the present invention. However, the wet etching property was poor since it does not satisfy the expression (3) defined in the present invention.

Nos. 2 to 4, 6 to 9 samples having the two-layer structure and Nos. 12 to 15 samples having the three-layer structure are examples of the present invention and showed excellent switching properties regarding TFT characteristics, similar to that of a conventional example having IZTO single layer as shown in FIG. 1.

TFT characteristics ($I_d$-$V_g$ characteristics) of a conventional example No. 1 and an example of the present invention No. 2 are shown in FIG. 5A and FIG. 5B, respectively. Sample No. 1 demonstrated excellent switching properties regarding the threshold voltage, S value, and mobility. As shown in FIG. 5A, the drain current $I_d$ rapidly increased at around gate voltage $V_g$=0 V in the course of sweeping the gate voltage from the negative side toward the positive range. Sample No. 2 also demonstrated excellent switching properties regarding the threshold voltage, S value, and mobility as an example of the present invention. As shown in FIG. 5B, the drain current $I_d$ rapidly increased at around gate voltage $V_g$=0 V.

As was the case with sample No. 2, TFTs Nos. 3, 4, 6 to 9, and 12 to 15 demonstrated excellent switching properties (their TFT characteristics are not shown in figures).

Moreover, the density of the oxide semiconductor layers of the samples Nos. 2 to 4, 6 to 9, and 12 to 15 was in a preferred range of about 6.1 g/cm$^3$.

The samples Nos. 2 to 4, 6 to 9, and 12 to 15 showed superior stress resistance to the conventional example No. 1.

Figure 6A:
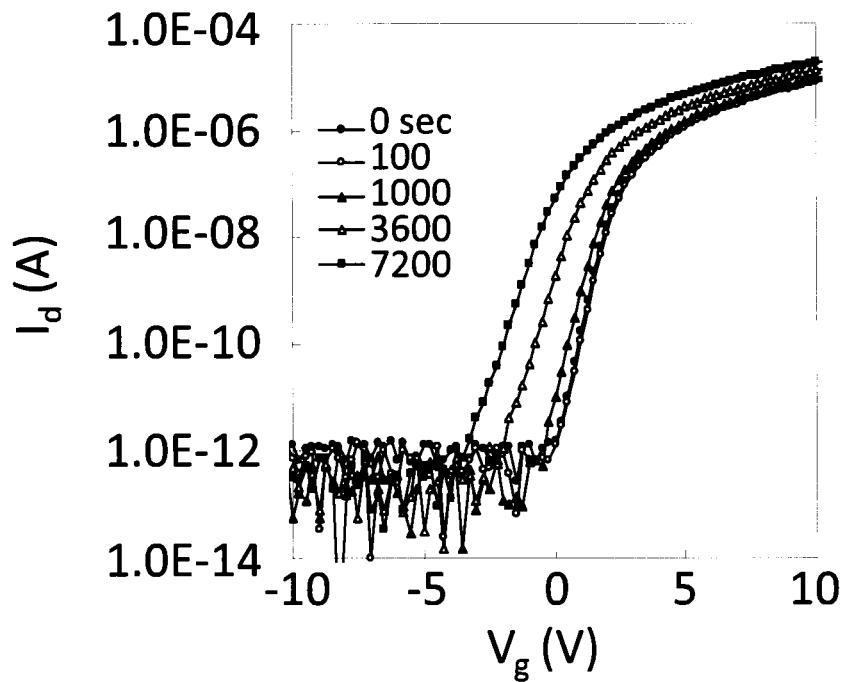
FIG. 6A shows the relationship between threshold voltage shift ($\Delta V_{th}$) and stress biasing duration of a conventional example (No. 1) in which IZTO single layer is used for the oxide semiconductor layer.
Figure 6B:
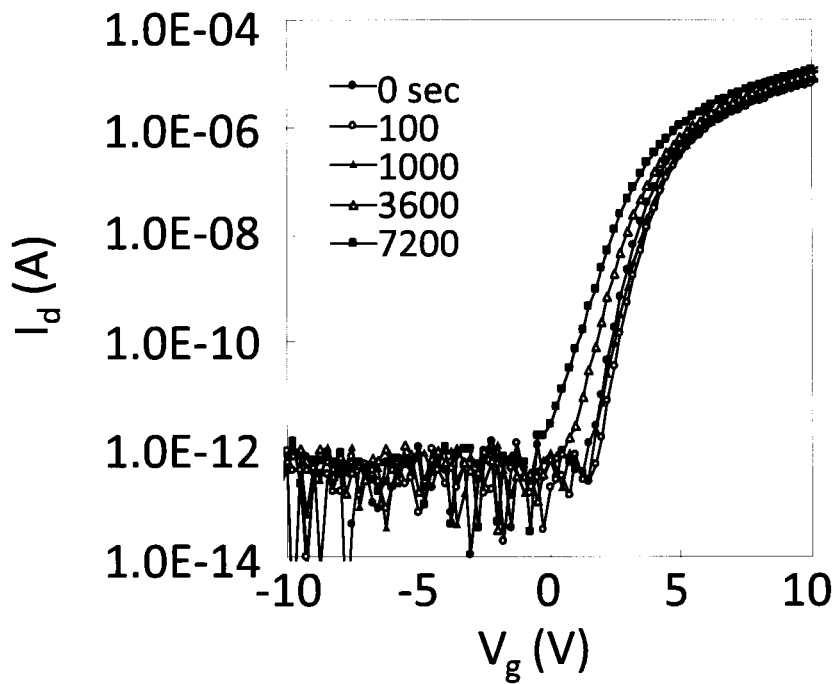
FIG. 6B shows the relationship between threshold voltage shift ($\Delta V_{th}$) and stress biasing duration of an example of the present invention (No. 2) in which a two-layer laminated structure comprising; a second oxide semiconductor IZTO layer on the lower side from the substrate and a first oxide semiconductor IGZO layer on the upper side from the substrate; is used for the oxide semiconductor layer.

The relationship between threshold voltage shift ($\Delta V_{th}$) and stress biasing duration of sample No. 1 and sample No. 2 are shown in FIG. 6A and FIG. 6B, respectively. The threshold voltage showed negative shift upon putting on the stress, and threshold voltage shift reached −2.8 V after 7200 seconds (2 hours) in sample No. 1 as plotted in FIG. 6A. Sample No. 2, on the other hand, showed smaller threshold voltage shift ($\Delta V_{th}$) as compared to sample No. 1 as shown in FIG. 6B. Its threshold voltage shift was −1.0 V after 7200 seconds (2 hours).

Figure 7:
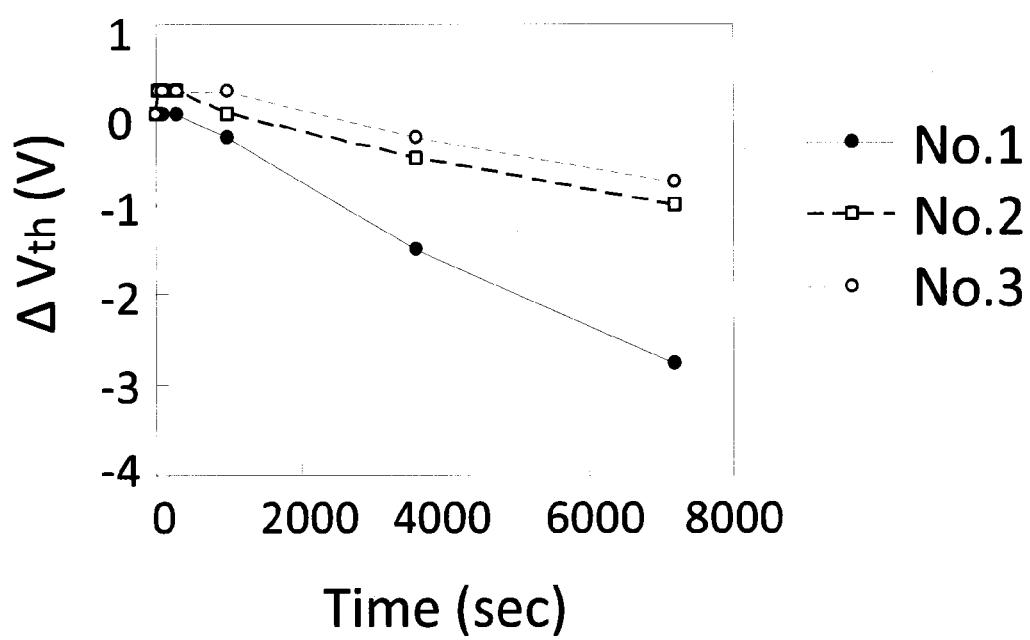
FIG. 7 shows the relationship between threshold voltage and stress biasing duration of a conventional example (No. 1) and examples of the present invention (Nos. 2 and 3).

Threshold voltage shifts $\Delta V_{th}$ (V) versus stress biasing duration of Nos. 1 to 3 are plotted in FIG. 7. The threshold voltage ($V_{th}$) shifted toward negative side with the stress biasing duration, and threshold voltage shift ($\Delta V_{th}$) reached −2.8 V after 7200 seconds (2 hours) in No. 1. Nos. 2 and 3, on the other hand, showed smaller threshold voltage shift toward the negative side as compared to No. 1. The threshold voltage shifts were −1.0 V and −0.8 V for No. 1 and No. 2, respectively, after 2 hours.

A similar trend to TFTs Nos. 2 and 3 was also observed in Nos. 4, 6 to 9, and 12 to 15. It was confirmed that Nos. 4, 6 to 9 having the two-layer structure and Nos. 12 to 15 having the three-layer structure show high mobility, excellent stress resistance, and the effect to suppressing deviations of the TFT characteristics by the light and negative bias stresses, as for Nos. 2 and 3.

Regarding particular to the stress resistance, it was confirmed in the present example that the effect to suppressing deviations of the TFT characteristics by the light and negative bias stresses can be improved by, interposing the first oxide semiconductor layer of IGZO including Ga between the second oxide semiconductor layer consisting of IZTO and either a passivation film or an etch stopper layer, as compared to a conventional example No. 1 which has no IGZO. It is inferred that the interface between the oxide semiconductor layer and either the passivation film or the etch stopper layer was stabilized in terms of chemical bonding, and hence become resistive to defects generation.

The effect to suppressing deviations of the TFT characteristics by the stresses was further promoted particularly as in Nos. 12 to 14 by interposing a third oxide semiconductor layer comprising Ga (IGZO in the present example) between a gate insulating film and the second oxide semiconductor layer (IZTO). This can be clearly understood by being contrasted with comparative examples such as Nos. 6 to 8 which do not comprise a third semiconductor layer. The effect to suppressing deviations of the TFT characteristics by the light and negative bias stresses was further promoted in Nos. 12 to 14 as demonstrated by respectively comparing two samples having a common chemical composition in terms of the second oxide semiconductor layer with and without a third layer, specifically, No. 6 (without the third oxide semiconductor layer) and No. 12 (with the third oxide semiconductor layer), No. 7 (without the third oxide semiconductor layer) and No.

13 (with the third oxide semiconductor layer), and No. 8 (without the third oxide semiconductor layer) and No. 14 (with the third oxide semiconductor layer).

On the other hand, the inferior stress resistance of conventional example No. 1 having single layer of oxide semiconductor consisting of IZTO may be considered due to accumulation of holes generated by the light irradiation and stress testing at the interface between the etch stopper layer and the oxide semiconductor layer.

No. 5 is a conventional example having single layer of oxide semiconductor layer consisting of IGZO. Due to the IGZO, No. 5 showed good stress resistance. However, the mobility was low due to the absence of the second oxide semiconductor layer comprising IZTO specified in the present invention.

No. 10 and No. 11 having oxide semiconductor layers of IZTO (the second oxide semiconductor) and IGZO (the first oxide semiconductor) are examples in which the IZTO did not satisfy the expression (1) specified in the present invention. Specifically, due to insufficient amount of Zn in the IZTO layer, the carrier density became excessively high, the threshold voltage largely turned to negative ($V_{th}$=−16 V and −22 V for No. 10 and No. 11, respectively), and the TFT characteristics were deteriorated, and thus change of the threshold voltage $\Delta V_{th}$ could not be measured (marked "-" in Table 3) in these comparative examples.

TFT characteristics were deteriorated in comparative examples Nos. 16 to 18 which do not comprise specified amounts of metals in the second oxide semiconductor layer IZTO and do not satisfy the expression (1) or (2) specified in the present invention (see Table 1).

Specifically, in No. 16 having an excessive amount of In (35 atomic % in Table 1), the carrier density became excessively high, the threshold voltage largely turned to negative ($V_{th}$=−17 V), and the mobility became low, and thus change of the threshold voltage $\Delta V_{th}$ could not be measured (marked "-" in Table 3).

Threshold voltage or the like could not be measured in Nos. 17 and 18 which had become conductive due to smaller amount of Zn compared to Sn. The result of evaluations are marked "-" in Table 3.

As shown above, by using a TFT having the oxide semiconductor layers as specified in the present invention, both the TFT characteristics and the stress resistance were improved as compared to those of Nos. 1 and 5 which have a conventional single layer oxide semiconductor.

EXPLANATION OF REFERENCE NUMERALS

1 Substrate
2 Gate electrode
3 Gate insulator layer
4 Second oxide semiconductor layer
4A First oxide semiconductor layer
4B Third oxide semiconductor layer
4C Oxide semiconductor layer
5 Source-drain electrode
6 Passivation film (insulating film)
7 Contact hole
8 Transparent conductive film
9 Etch stopper layer

The invention claimed is:

1. A thin film transistor comprising:
a substrate;
a gate electrode;
a gate insulating film;
oxide semiconductor layers;
a source electrode;
a drain electrode; and
a passivation film configured to protect the oxide semiconductor layers, wherein
the oxide semiconductor layers are laminated layers comprising:
a second oxide semiconductor layer consisting of In, Zn, Sn, and O, and
a first oxide semiconductor layer consisting of In, Ga, Zn, and O,
the second oxide semiconductor layer is formed on the gate insulating film, and
the first oxide semiconductor layer is formed between the second oxide semiconductor layer and the passivation film.

2. The thin film transistor according to claim 1, wherein chemical composition of the second oxide semiconductor layer satisfies the requirements represented by
expression (1) shown below if [In] / ([In] +[Sn]) <0.50, or expression (2) shown below if [In] / ([In] +[Sn]) >0.50:

$$[In]/([In]+[Zn]+[Sn]) <1.4 \times \{[Zn]/([Zn]+[Sn])\}-0.5 \quad (1)$$

$$[In]/([In]+[Zn]+[Sn]) <0.3 \quad (2)$$

wherein [In], [Zn], and [Sn] respectively represent the content in atomic % of In, Zn, and Sn relative to a total content of all metal elements in the oxide.

3. The thin film transistor according to claim 1, wherein chemical composition of the second oxide semiconductor layer further satisfies the requirements represented by expression (3) shown below:

$$[Zn]/([In]+[Zn]+[Sn]) <0.830. \quad (3)$$

4. The thin film transistor according to claim 1, wherein a third oxide semiconductor layer comprising Ga is formed between the second oxide semiconductor layer and the gate insulating film.

5. The thin film transistor according to claim 4, wherein the third oxide semiconductor layer consists of In, Ga, Zn, and O.

6. The thin film transistor according to claim 1, wherein the second oxide semiconductor layer has a thickness of greater than or equal to 3 nm.

7. The thin film transistor according to claim 1, wherein the oxide semiconductor layers have a total film density of greater than or equal to 6.0 g/cm$^3$.

8. A display device comprising the thin film transistor according to claim 1.

9. A thin film transistor comprising:
a substrate;
a gate electrode;
a gate insulating film;
oxide semiconductor layers;
an etch stopper layer configured to protect a surface of the oxide semiconductor layers, wherein
the oxide semiconductor layers are laminated layers comprising:
a second oxide semiconductor layer consisting of In, Zn, Sn, and O, and
a first oxide semiconductor layer consisting of In, Ga, Zn, and O,
the second oxide semiconductor layer is formed on the gate insulating film, and
the first oxide semiconductor layer is formed between the second oxide semiconductor layer and the etch stopper layer.

10. The thin film transistor according to claim 9, wherein a third oxide semiconductor layer comprising Ga is formed between the second oxide semiconductor layer and the gate insulating film.

11. The thin film transistor according to claim 10, wherein the third oxide semiconductor layer consists of In, Ga, Zn, and O.

12. The thin film transistor according to claim 9, wherein chemical composition of the second oxide semiconductor layer satisfies the requirements represented by expression (1) shown below if [In] / ([In] +[Sn]) <0.50, or expression (2) shown below if [In] / ([In] +[Sn]) >0.50:

$$[In]/([In]+[Zn]+[Sn]) \leq 1.4 \times \{[Zn]/([Zn]+[Sn])\} - 0.5 \quad (1)$$

$$[In]/([In]+[Zn]+[Sn]) \leq 0.3 \quad (2)$$

wherein [In], [Zn], and [Sn] respectively represent the content in atomic % of In, Zn, and Sn relative to a total content of all metal elements in the oxide.

13. The thin film transistor according to claim 9, wherein chemical composition of the second oxide semiconductor layer further satisfies the requirements represented by expression (3) shown below:

$$[Zn]/([In]+[Zn]+[Sn]) < 0.830. \quad (3)$$

14. The thin film transistor according to claim 9, wherein the second oxide semiconductor layer has a thickness of greater than or equal to 3 nm.

15. The thin film transistor according to claim 9, wherein the oxide semiconductor layers have a total film density of greater than or equal to 6.0 $g/cm^3$.

16. A display device comprising the thin film transistor according to claim 9.

* * * * *